United States Patent
Jeong (10) Patent No.: US 10,515,702 B2
(45) Date of Patent: Dec. 24, 2019

(54) PRECHARGE CIRCUIT, AND MEMORY DEVICE AND SRAM GLOBAL COUNTER USING PRECHARGE CIRCUIT

(71) Applicant: SK hynix Inc., Gyeonggi-do (KR)

(72) Inventor: Hoesam Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 15/902,376

(22) Filed: Feb. 22, 2018

(65) Prior Publication Data

US 2019/0019560 A1 Jan. 17, 2019

(30) Foreign Application Priority Data

Jul. 17, 2017 (KR) ........................ 10-2017-0090276

(51) Int. Cl.
| | | |
|---|---|---|
| *G11C 11/00* | (2006.01) | |
| *G11C 16/24* | (2006.01) | |
| *G11C 16/26* | (2006.01) | |
| *G11C 7/06* | (2006.01) | |
| *G11C 7/04* | (2006.01) | |
| *G11C 7/12* | (2006.01) | |
| *G11C 7/22* | (2006.01) | |
| *G11C 11/419* | (2006.01) | |
| *G11C 11/417* | (2006.01) | |

(52) U.S. Cl.
CPC ............... *G11C 16/24* (2013.01); *G11C 7/04* (2013.01); *G11C 7/06* (2013.01); *G11C 7/12* (2013.01); *G11C 7/222* (2013.01); *G11C 11/417* (2013.01); *G11C 11/419* (2013.01); *G11C 16/26* (2013.01)

(58) Field of Classification Search
CPC ....... G11C 11/413; G11C 16/24; G11C 16/26; G11C 7/04; G11C 7/06; G11C 7/12
See application file for complete search history.

(56) References Cited

U.S. PATENT DOCUMENTS

| | | | | |
|---|---|---|---|---|
| 6,108,256 | A * | 8/2000 | Schneider | G11C 7/12 365/154 |
| 9,449,658 | B2 * | 9/2016 | Lim | G11C 7/1048 |
| 2005/0213404 | A1 * | 9/2005 | Kodama | G11C 7/12 365/203 |
| 2010/0202189 | A1 * | 8/2010 | Jung | G11C 7/02 365/149 |
| 2015/0249439 | A1 * | 9/2015 | Kozuma | H03K 17/6871 327/534 |

FOREIGN PATENT DOCUMENTS

| | | |
|---|---|---|
| KR | 1019990006815 | 1/1999 |
| KR | 1020140131174 | 11/2014 |

* cited by examiner

*Primary Examiner* — Hien N Nguyen
(74) *Attorney, Agent, or Firm* — IP & T Group LLP

(57) ABSTRACT

A precharge circuit includes: a precharge time controller suitable for generating a precharge time control signal based on a threshold voltage of a transistor; a precharge control signal generator suitable for generating a precharge control signal activated during a predetermined period based on the precharge time control signal from the precharge time controller; and a precharger suitable for precharging a bit line and a bit line bar during the predetermined period based on the precharge control signal from the precharge control signal generator.

20 Claims, 4 Drawing Sheets

PRECHARGE CIRCUIT, AND MEMORY DEVICE AND SRAM GLOBAL COUNTER USING PRECHARGE CIRCUIT

CROSS-REFERENCE TO RELATED APPLICATION

This application claims priority under 35 U.S.C. § 119 to Korean Patent Application No. 10-2017-0090276 filed on Jul. 17, 2017, which is incorporated herein by reference in its entirety.

BACKGROUND

1. Field

Exemplary embodiments relate to a memory device. Particularly, exemplary embodiments relate to a precharge circuit for precharging a bit line and a bit line bar of a memory element, a memory device including a memory element such as an SRAM cell which is precharged by the precharge circuit, and an SRAM global counter embodied using SRAM cells which are precharged by the precharge circuit.

2. Discussion of the Related Art

Generally, in a memory device such as, e.g., a CMOS image sensor (CIS), a counter counts image data for one row time, converts the image data into a digital code, and transfers the digital code to a digital block of a subsequent stage.

A counter may largely fall into a local counter and a global counter. In general, a CMOS image sensor has been embodied mainly by using the local counter. However, a growing number of CMOS image sensors are being developed or being mass-produced by using the global counter. This is because the global counter provides advantages such as reduced power and area so that the quality of CMOS image sensor using it can be improved, in comparison with the local counter. In particular, by using an SRAM global counter which uses SRAM cells, the area can be further reduced.

When it comes to the SRAM global counter, however, issues may arise because the stored value in an SRAM cell tends to change at a high voltage, while a sense amplifier does not properly sense data values at a low voltage. These issues are observed regardless of the characteristics of transistors that vary.

In this regard, background descriptions are made below as to the phenomenon that the stored value in an SRAM cell changes due to the structural limitation of the SRAM cell and a corner change when a high voltage is supplied to both ends of the SRAM cell. Both ends of the SRAM cell mean a bit line and a bit line bar.

The basic operation principle of an SRAM cell is as follows: a write operation is performed by applying predetermined voltage values as both ends' voltages, whereas in a read operation, after applying a power supply voltage VDD as both ends' voltages, the magnitude of either one of the both ends' voltages is changed according to the value stored in the SRAM cell to induce a voltage difference between the both ends' voltages, and then a sense amplifier senses the difference between both ends' voltages.

In this regard, when performing the operation of reading a value stored in the SRAM cell, if the both ends' voltages and the loading capacitance are substantially large, a problem is caused in that the SRAM cell may not change the magnitude of either one of both ends' voltages, and rather the internally stored value may change by both ends' voltages. In order to address this problem, an SNM (static noise margin, which is a margin for preventing the stored value of an SRAM cell from changing) is taken into consideration in designing an SRAM cell.

Nonetheless, when it comes to an SRAM cell used in an SRAM global counter of a CMOS image sensor (CIS), the loading capacitance is very large, which is equivalent to a power supply voltage VDD being applied, and therefore the stored value of the SRAM cell tends to be distorted frequently. In particular, the distortion phenomenon occurs more often at a fast-slow (FS) corner (where the letter F refers to the characteristic of an NMOS transistor and the letter S refers to the characteristic of a PMOS transistor). Due to the nature of a CMOS image sensor (CIS), an error in only one SRAM cell would even cause the entire chip to become a defective product, which will adversely affect the yield of the CIS chips.

On the other hand, in the case of reading the stored value of an SRAM cell, there are largely two time periods within one cycle. The first time as a precharge period corresponds to an operation of initializing the voltages of a bit line and a bit line bar with a power supply voltage VDD before the SRAM cell is turned on. The second time as a sensing period corresponds to an operation in which the SRAM cell is actually turned on, and the node voltage of one of the bit line and the bit line bar is dropped to induce a difference between both ends' voltages, which a sense amplifier reads out.

If the precharge period is too short or the sensing period is too short, the probability of an error that the sense amplifier does not sense the stored value of the SRAM cell increases. Conversely, if the precharge period is too long, the probability of an error that the stored value of the SRAM cell changes increases.

Describing this in more detail, if a sensing time is short, since the difference between the both ends' voltages would not be sufficient, the possibility of the sense amplifier not being able to sense the value of the difference exists. Therefore, although the sensing time should be sufficient, it would lead to a decrease in the precharge time with the time of one cycle being fixed and the operating speed increasing. If the precharge time decreases, it will also negatively affect the sensing performance of the sense amplifier because the precharge would not be performed.

In addition, as the number of SRAM cells increases in a high pixel product, the loading capacitance inevitably increases, and the lengths of the precharge time and the sensing time transferred to the SRAM cells vary depending on their positions, resulting in more difficulties for a stable operation.

SUMMARY

Various embodiments are directed to providing a precharge circuit for controlling a precharge time by using the threshold voltage (Vt) of a transistor.

Also, various embodiments are directed to providing a memory device including a memory element such as an SRAM cell or the like which is precharged by such a precharge circuit.

Further, various embodiments are directed to providing an SRAM global counter embodied using SRAM cells which are precharged by such a precharge circuit.

In an embodiment, a precharge circuit may include: a precharge time controller suitable for generating a precharge time control signal based on a threshold voltage of a transistor; a precharge control signal generator suitable for generating a precharge control signal activated during a predetermined period based on the precharge time control signal from the precharge time controller; and a precharger suitable for precharging a bit line and a bit line bar during the predetermined period based on the precharge control signal from the precharge control signal generator.

In an embodiment, a memory device may include: a plurality of memory cells suitable for storing data; and a precharge circuit suitable for precharging a selected memory cell among the plurality of memory cells with a precharge time based on a threshold voltage of a transistor.

In an embodiment, an SRAM global counter may include: a counting circuit including a plurality of SRAM cells; a precharge circuit suitable for precharging a selected SRAM cell in the counting circuit with a precharge time based on a threshold voltage of a transistor; and a sense amplifier suitable for sensing the selected SRAM cell precharged by the precharge circuit.

DETAILED DESCRIPTION

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in the form of a singular form, the present embodiment is not limited thereto, but the corresponding components may also be represented in the form of a plural form.

Hereinafter, the various embodiments of the present invention will be described in detail with reference to the attached drawings.

Figure 1:
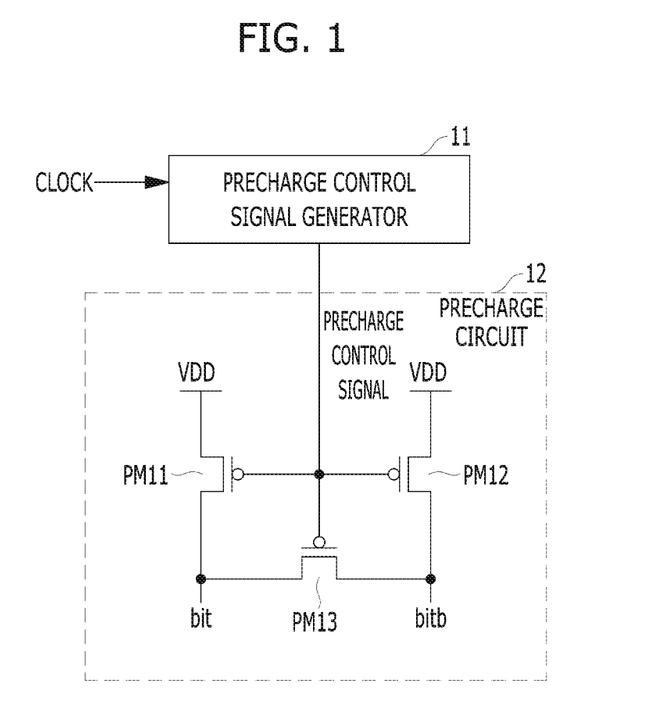
FIG. 1 is a diagram illustrating an exemplary configuration of a precharge circuit according to one embodiment of the present disclosure.

FIG. 1 is a diagram illustrating an exemplary configuration of a precharge circuit according to one embodiment of the present disclosure.

As shown in FIG. 1, the precharge circuit according to one embodiment of the present disclosure may include a precharge control signal generator 11 for generating a precharge control signal according to a clock from an external clock supply circuit (not shown) and a precharger 12 for precharging a bit line and a bit line bar according to the precharge control signal generated by the precharge control signal generator 11.

In accordance with one embodiment, the precharger 12 may include a PMOS transistor PM11 having a source terminal to which a power supply voltage VDD is applied and a gate terminal to which the precharge control signal is applied, a PMOS transistor PM12 having a source terminal to which the power supply voltage VDD is applied and a gate terminal to which the precharge control signal is applied, and a PMOS transistor PM13 having a source terminal to which the drain terminal of the PMOS transistor PM11 is coupled, a gate terminal to which the precharge control signal is applied, and a drain terminal to which the drain terminal of the PMOS transistor PM12 is coupled.

An exemplary operation of the precharge circuit illustrated in FIG. 1 according to one embodiment is described as follows. First, if the precharge control signal is applied from the precharge control signal generator 11, all of the three PMOS transistors PM11, PM12, and PM13 are turned on. Accordingly, the two PMOS transistors PM11 and PM12 cause the voltages of the bit line and the bit line bar to change to the power supply voltage VDD, and the PMOS transistor PM13 causes the voltages of the bit line and the bit line bar to become the same with each other.

Figure 2A:
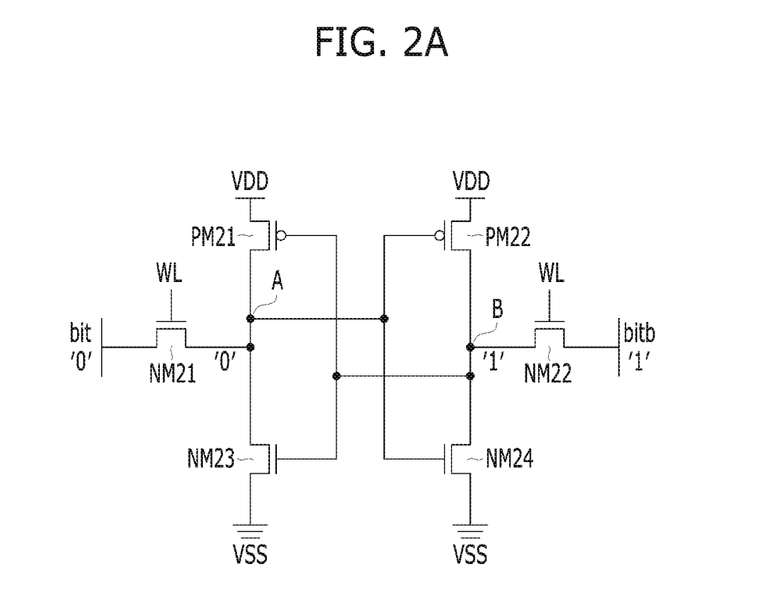
FIG. 2A is a circuit diagram illustrating an exemplary SRAM cell according to one embodiment of the present disclosure.

FIG. 2A is a circuit diagram illustrating an exemplary SRAM cell according to one embodiment of the present disclosure.

As shown in FIG. 2A, the SRAM cell according to one exemplary embodiment of the present disclosure may include a PMOS transistor PM21 having a source terminal to which a power supply voltage VDD is applied, a PMOS transistor PM22 having a source terminal to which the power supply voltage VDD is applied, an NMOS transistor NM21 having a source terminal to which the drain terminal of the PMOS transistor PM21 is coupled, a gate terminal to which a word line WL is coupled, and a drain terminal to which a bit line is coupled, and an NMOS transistor NM22 having a source terminal to which the drain terminal of the PMOS transistor PM22 is coupled, a gate terminal to which the word line WL is coupled, and a drain terminal to which a bit line bar is coupled. The SRAM cell may further include a cell node A to which the drain terminal of the PMOS transistor PM21 and the source terminal of the NMOS transistor NM21 are coupled in common, a cell bar node B to which the drain terminal of the PMOS transistor PM22 and the source terminal of the NMOS transistor NM22 are coupled in common, an NMOS transistor NM23 having a drain terminal which is coupled to the cell node A, a gate terminal to which the cell bar node B and the gate terminal of the PMOS transistor PM21 are coupled in common, and a source terminal to which a ground voltage VSS is applied, and an NMOS transistor NM24 having a drain terminal which is coupled to the cell bar node B, a gate terminal to which the cell node A and the gate terminal of the PMOS transistor PM22 are coupled in common, and a source terminal to which the ground voltage VSS is applied.

The SRAM cell as described above may constitute a CMOS latch circuit (cross-coupled inverters including the transistors PM21, PM22, NM23, and NM24) which includes two PMOS transistors PM21 and PM22 performing a pull-up function and two NMOS transistors NM23 and NM24 performing a pull-down function.

In other words, the output node of a first inverter, which includes the PMOS transistor PM21 and the NMOS transistor NM23, is coupled to the cell node A, and the cell node A is coupled to the bit line through the NMOS transistor NM21 which is driven by the word line WL.

On the other hand, the output node of a second inverter, which includes the PMOS transistor PM22 and the NMOS transistor NM24, is coupled to the cell bar node B, and the cell bar node B is coupled to the bit line bar through the NMOS transistor NM22 which is similarly driven by the word line WL.

In the SRAM cell including the six transistors PM21, PM22, NM21, NM22, NM23, and NM24 as described above, data read and write operations drive the pair of bit line and bit line bar. First, in the write operation, after charging inverse values to the bit line and the bit line bar (e.g., bit line=0 and bit line bar=1), by applying '1' to the word line WL, the two NMOS transistors NM21 and NM22, which perform switching functions, are turned on. Then, the pair of first and second inverters are switched by the two NMOS transistors NM21 and NM22 which are switched on by the word line WL. That is to say, the cell node A is inverted from to '1' to '0', and the cell bar node B is inverted from '0' to '1' (see the stored values of FIG. 2A).

Next, in the operation for reading the data of the SRAM cell, after precharging the bit line and the bit line bar with the same voltage for a precharge period, any one voltage of the voltages of the bit line and the bit line bar is changed by the values stored in the cell node A and the cell bar node B by applying '1' to the word line WL for a sensing period to induce a voltage difference between the voltages of the bit line and the bit line bar, and the difference value between respective voltages at both ends (i.e., the bit line and the bit line bar) is sensed.

In regards to the read operation, when the both-end voltages and a loading capacitance are substantially large, a problem may arise in that the SRAM cell may not change the magnitude of any one voltage of the both-end voltages and rather the internally stored value may change by the both-end voltages. This will be described in detail with reference to FIGS. 2A and 2B.

Figure 2B:
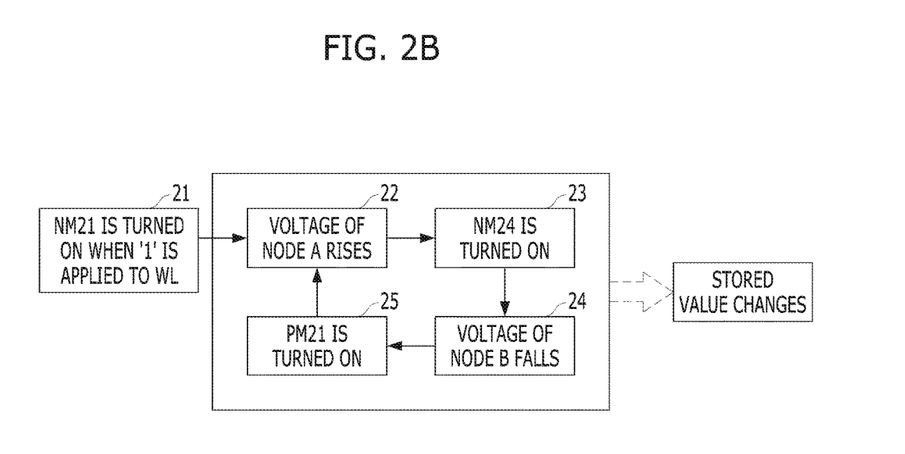
FIG. 2B is a diagram describing a phenomenon in which the stored value of the SRAM cell is distorted.

FIG. 2B is a diagram describing a phenomenon in which the stored value of the SRAM cell is distorted.

When performing the read operation as described above, after precharging the bit line and the bit line bar, by applying '1' to the word line WL, the NMOS transistor NM21 is turned on (21). Accordingly, the voltage of the cell node A rises (22). Then, the NMOS transistor NM24 is turned on (23), and thus the voltage of the cell bar node B falls (24). Then, the PMOS transistor PM21 is turned on (25). Accordingly, as the voltage of the cell node A rises again, a problem may occur in that the stored value of the cell node A is changed from '0' to '1.'

Moreover, when an SRAM cell is used in an SRAM global counter of a CMOS image sensor (CIS), since a loading capacitance is very large, the SRAM cell may behave as if a power supply voltage VDD was applied, and the stored value of the SRAM cell may be distorted frequently. In particular, the distortion issue occurs very often at a Fast-Slow (FS) corner.

In this way, when an SRAM global counter is used, the stored value of an SRAM cell may be distorted at a high voltage, and, conversely, a sense amplifier may not properly sense a value at a low voltage.

Meanwhile, if the precharge period is too short or the sensing period is too short, the probability of an error where the sense amplifier does not sense the stored value of the SRAM cell increases. Further, if the precharge period is too long, the probability of an error where the stored value of the SRAM cell changes increases.

Therefore, in accordance with embodiments of the present disclosure, by controlling the precharge time of a bit line and a bit line bar of a memory element such as an SRAM cell based on the use of the threshold voltage Vt of a transistor, it is possible to prevent a distortion of the stored value of the SRAM cell, and thus a sense amplifier may accurately sense the stored value of the SRAM cell. This will be described below in detail with reference to FIGS. 3A to 5.

Figure 3A:
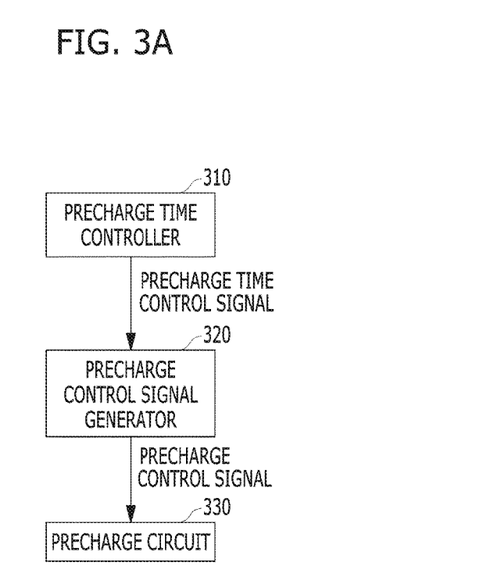
FIG. 3A is a diagram illustrating a precharge circuit in accordance with an exemplary embodiment of the present disclosure.
Figure 3B:
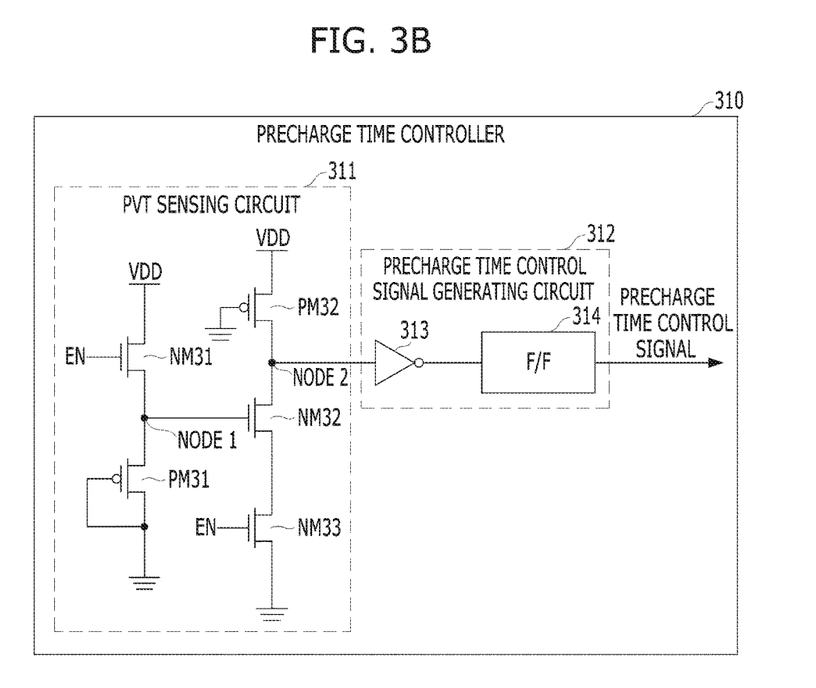
FIG. 3B is a diagram illustrating the precharge time controller of FIG. 3A.
Figure 3C:
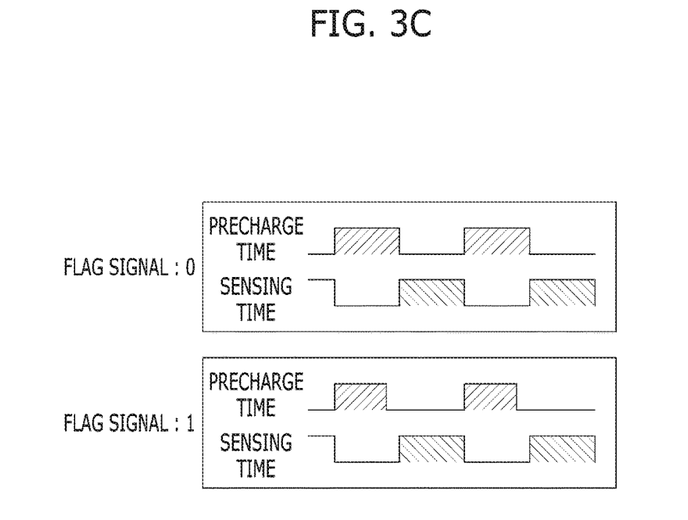
FIG. 3C is a diagram showing how the precharge time is controlled depending on a precharge time control signal in accordance with one exemplary embodiment of the present disclosure.

FIG. 3A is a diagram illustrating a precharge circuit in accordance with an exemplary embodiment of the present disclosure, and FIG. 3B is a diagram illustrating the precharge time controller of FIG. 3A. FIG. 3C is a diagram showing how the precharge time is controlled depending on a precharge time control signal in accordance with one exemplary embodiment of the present disclosure.

As shown in FIG. 3A, the precharge circuit in accordance with one embodiment of the present disclosure may include a precharge time controller 310 for generating a precharge time control signal based on the threshold voltage Vt of a transistor, a precharge control signal generator 320 for generating a precharge control signal activated during a predetermined period based on the precharge time control signal from the precharge time controller 310, and a precharger 330 for precharging a bit line and a bit line bar during the predetermined period based on the precharge control signal from the precharge control signal generator 320.

As shown in FIG. 3B, the precharge time controller 310 includes a PVT sensing circuit 311 for sensing a process, voltage, and temperature (PVT) condition applied to a memory element (for example, an SRAM cell) and generating a PVT condition sensing result signal, and a precharge time control signal generating circuit 312 for generating the precharge time control signal depending on the PVT condition sensing result signal from the PVT sensing circuit 311.

In accordance with one embodiment, the PVT sensing circuit 311 may include an NMOS transistor NM31 having a drain terminal to which a power supply voltage VDD is applied, a gate terminal to which an enable signal EN is applied, and a source terminal which is coupled to a node 1, and a PMOS transistor PM31 having a source terminal which is coupled to the node 1 and a gate terminal and a drain terminal to which a ground voltage VSS is applied. The gate terminal and the drain terminal of the PMOS transistor PM31 are diode-connected so that the PMOS transistor PM31 is always turned on due to the ground voltage VSS and serves as a resistor. The PVT sensing circuit 311 may further include a PMOS transistor PM32 having a source terminal to which the power supply voltage VDD is applied, a gate terminal to which the ground voltage VSS is applied, and a drain terminal which is coupled to a node 2, an NMOS transistor NM32 having a drain terminal which is coupled to the node 2, a gate terminal which is coupled to the node 1, and a source terminal which is coupled to the drain terminal of an NMOS transistor NM33, and the NMOS transistor NM33 having the drain terminal which is coupled to the source terminal of the NMOS transistor NM32, a gate terminal to which the enable signal EN is applied, and a source terminal to which the ground voltage VSS is applied.

The precharge time control signal generating circuit 312 includes an amplification part 313 for amplifying the PVT condition sensing result signal from the PVT sensing circuit 311 and a storage part 314 for storing the PVT condition sensing result signal amplified by the amplification part 313. The amplification part 313 may be embodied as, for example, an inverter for inverting and amplifying the PVT condition sensing result signal from the PVT sensing circuit 311, and the storage part 314 may be embodied as, for example, a flip-flop F/F for storing the PVT condition sensing result signal inverted and amplified by the inverter.

The enable signal EN may use a signal of the same timing as a counter enable signal. Alternatively, by performing PVT condition sensing and storing the condition sensing result signal at an early time of each frame based on an enable signal for each frame, the PVT condition sensing result signal is stored in a flip-flop, and thus there would not be any issue even when the enable signal is turned off for a certain period of time.

For the operation of generating the precharge time control signal (for example, a flag signal), a characteristic difference depending on the corner of a transistor, a voltage, and a temperature will be described below according to one embodiment.

First, as for a characteristic difference according to the corner (e.g., Fast-Slow FS or Slow-Fast SF corner) of a transistor, the voltage change of the node '1' is controlled using the difference between the turn-on resistances of the NMOS transistor NM31 and the PMOS transistor PM31. More specifically, in order to utilize the characteristic that the resistance value decreases in response to Fast and increases in response to Slow, the NMOS transistor NM31 is disposed between the power supply voltage VDD and the ground voltage VSS, and the PMOS transistor PM31 is disposed between the node '1' and the ground voltage VSS so that the voltage change at the node '1' is controlled. In the next stage, in a similar manner, the voltage change at the node '2' is controlled by the PMOS transistor PM32 between the power supply voltage VDD and the node '2' and the NMOS transistor NM32 and the NMOS transistor NM33 between the node '2' and the ground voltage VSS. At this time, the voltage at the node '2' changes inversely to the voltage at the node '1.' For example, in the case of an FS corner, the voltage at the node '1' becomes higher in comparison with a Typical-Typical (TT) corner, and because the gate bias voltage of the NMOS transistor NM32 becomes high, the voltage of the node '2' becomes lower, which causes the node '2' to turn low, and thus the output of the inverter becomes logic high. As a result, '1' is outputted as the precharge time control signal (for example, the flag signal). In the case of the SF corner, the output of the inverter becomes low as opposed to the above-described operation, and, as a result, '0' is outputted as the precharge time control signal. While FIG. 3B illustrates that the PVT sensing circuit 311 includes two stages according to one embodiment, it is to be noted that the PVT sensing circuit 311 may be embodied in more stages such as three or four stages.

The flag signal may be, for example, two levels of signals of '0' and or may be more levels (three or four) of signals. Further, while the flag signal may be embodied as a digital signal as described above, it is to be noted that the flag signal may be embodied as an analog signal.

Next, as for a characteristic difference according to a variation of the power supply voltage VDD, when the power supply voltage VDD rises, the operations of the PMOS transistor PM32, the NMOS transistor NM32, and the NMOS transistor NM33 of the rear stage may be taken into account. For example, by the appropriate size control of transistors (e.g., by making a trans-conductance($g_m$) of the PMOS transistor PM32 larger than a trans-conductance($g_m$) of the NMOS transistor NM32), the PMOS transistor PM32 is configured to operate mainly in a triode region, and the NMOS transistor NM32 is configured to operate in a saturation region. As the power supply voltage VDD increases, current also increases, which may be regarded as a decrease in the turn-on resistance of a transistor. Since the resistance value of the saturation region decreases more rapidly than the triode region, the voltage of the node '2' becomes low.

Further, as for an operation depending on a temperature variation, the case that the temperature rises may be explained similarly to the case of the power supply voltage VDD. When the temperature rises, since the threshold voltage Vt of a transistor decreases, and the turn-on resistance of a transistor in the saturation region tends to decrease more, the voltage of the node '2' becomes low.

The precharge control signal generator 320 generates the precharge control signal activated during a predetermined period depending on the precharge time control signal from the precharge time controller 310. For example, the precharge control signal generator 320 may generate a first precharge control signal activated during a first predetermined period (e.g., a longer period) when the flag signal '0' is inputted from the precharge time controller 310, and may generate a second precharge control signal activated during a second predetermined period (e.g., a shorter period) when the flag signal '1' is inputted from the precharge time controller 310.

In accordance with one embodiment, the precharge control signal generator 320 generates a pulse signal (precharge control signal) activated during a predetermined period to provide to the precharger 330. In this regard, there is generally one option to control the activation period of the pulse signal, and the activation period of the pulse signal may be controlled depending on the flag signal. Alternatively, as another scheme, two or more precharge control signal generators 320 may be provided such that the respective precharge control signal generators 320 are configured to generate pulse signals of different activation periods, and then any one of the two or more precharge control signal generators 320 may be selected depending on the flag signal. In another embodiment in which there are an increased number of flag signal types, the precharge control signal generator 320 generates the precharge control signal activated during a predetermined period based on each different flag signal type.

The precharger 330 precharges the bit line and the bit line bar of a memory element for a precharge time depending on the precharge control signal from the precharge control signal generator 320. An exemplary configuration of the precharger 330 may include the precharger 12 described above with reference to FIG. 1.

As described above, in accordance with one or more embodiments of the present disclosure, the period of the precharge time is controlled based on current PVT characteristics by using the threshold voltage Vt of a transistor. Namely, the precharge time is controlled to be long in the case where the read characteristic of the sense amplifier is insufficient (at this time, the precharge time is controlled with the sensing time being secured already), and the precharge time is controlled to be short in the case where the possibility of the stored value in an SRAM cell changing is high.

To this end, the precharge time controller 310, which generates the precharge time control signal by sensing the threshold voltage Vt of a transistor, is provided. That is to say, after monitoring information on the characteristics of a transistor (e.g., the process and the voltage) and the surrounding environments (e.g., the temperature), the results are stored, and the stored values are reflected on precharge time control. In this regard, since the characteristics of a transistor are determined when the chip is fabricated, and the surrounding environments change significantly slower when compared to the operation speed of the CMOS image sensor (CIS), it is not necessary to frequently refresh monitoring results. For example, sensing and storing operations may be performed for a short time only at the beginning of each frame or every 20 frames or 40 frames, for instance.

As a result, because the threshold voltage Vt of a transistor changes depending on changes in the external environments and the semiconductor's manufacturing process, the precharge time controller 310 may control the precharge time by automatically reflecting the corresponding the external environments and the semiconductor's manufacturing process, and, therefore, it is not necessary to control the precharge time from the exterior. In other words, by controlling the precharge time using the change in the threshold voltage (Vt) of a transistor, it is possible to automatically control the precharge level in conformity with the environments and the process without separate external control.

When a region for a sense amplifier to read is defined as a read margin (RM), and a region for preventing the stored value of an SRAM cell from changing is defined as a static noise margin (SNM), RM and SNM have a trade-off relationship. In other words, RM degrades if the power supply voltage is low, and SNM degrades if the power supply voltage is high. Further, RM degrades as the characteristic of the transistor is the SF corner, and SNM degrades as the characteristic of the transistor is the FS corner.

Therefore, in accordance with one embodiment of the present disclosure, the precharge time may be controlled to be long when the voltage is low and changes to the SF corner, and may be controlled to be short when the voltage is high and changes to the FS corner.

FIG. 3C is a diagram showing how the precharge time is controlled depending on the precharge time control signal in accordance with one exemplary embodiment of the present disclosure.

As shown in FIG. 3C, the precharge time is lengthened when the flag signal is '0,' and is shortened when the flag signal is '1.'

In accordance with one exemplary embodiment, the flag signal is more likely to become '0' with the SF corner and a low power supply voltage, whereas the flag signal is more likely to become with the FS corner and a high power supply voltage.

While a scheme of controlling the precharge time is described in the embodiment of the present disclosure, it is to be noted that a scheme of controlling the sensing time by using the threshold voltage Vt of a transistor may be embodied.

Figure 4:
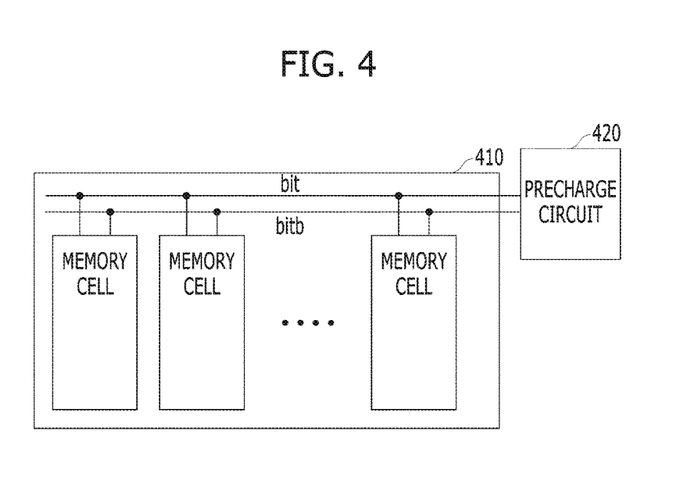
FIG. 4 shows an exemplary configuration of a memory device using a precharge circuit in accordance with an embodiment of the present disclosure.

FIG. 4 shows an exemplary configuration of a memory device using a precharge circuit in accordance with an embodiment of the present disclosure.

As shown in FIG. 4, the memory device using a precharge circuit in accordance with one embodiment of the present disclosure includes a plurality of memory cells 410 for storing data, and a precharge circuit 420 for precharging a predetermined memory cell among the plurality of memory cells 410 by controlling a precharge time using the threshold voltage Vt of a transistor.

The plurality of memory cells 410 may be a plurality of SRAM cells, and the precharge circuit 420 may be embodied using the precharge circuit described above with reference to FIG. 3A. The predetermined memory cell means a memory cell which is selected by a column select signal (for example, a word line).

Figure 5:
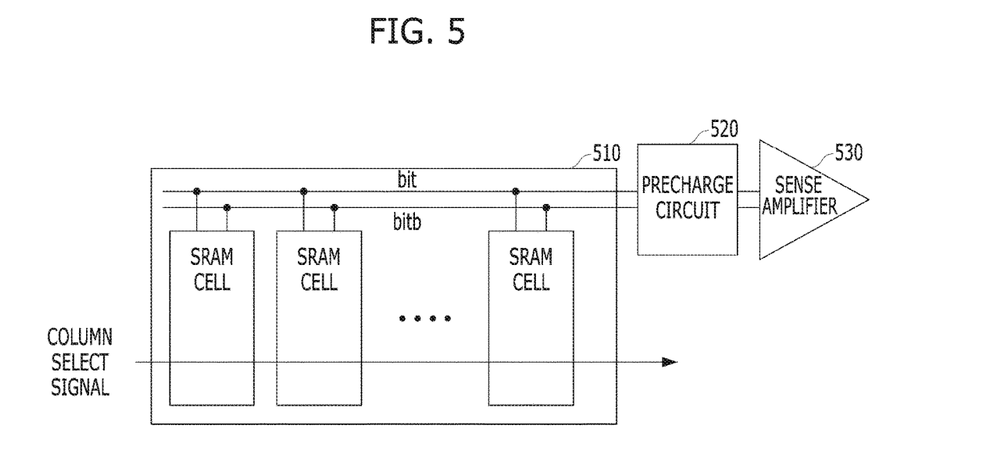
FIG. 5 shows an exemplary configuration of an SRAM global counter using a precharge circuit in accordance with an embodiment of the present disclosure.

FIG. 5 shows an exemplary configuration of an SRAM global counter using a precharge circuit in accordance with an embodiment of the present disclosure.

As shown in FIG. 5, the SRAM global counter using a precharge circuit in accordance with one embodiment of the present disclosure includes a counting circuit 510 which is embodied using a plurality of SRAM cells, a precharge circuit 520 for precharging a predetermined SRAM cell in the counting circuit 510 by controlling a precharge time using the threshold voltage Vt of a transistor, and a sense amplifier 530 for sensing the predetermined SRAM cell precharged by the precharge circuit 520.

In accordance with one exemplary embodiment, the counting circuit 510 may be any suitable SRAM global counting circuit which is embodied using a plurality of SRAM cells which are selected by a column select signal from a control circuit (not shown) and store counting data.

The precharge circuit 520 may be embodied using the precharge circuit described above with reference to FIG. 3A. The predetermined SRAM cell means an SRAM cell which is selected by the column select signal. The sense amplifier 530 may be any suitable sense amplifier configured to sense and amplify data from the counting circuit 510.

According to various embodiments of the present disclosure, it is possible to control a precharge time using the threshold voltage Vt of a transistor.

Also, according to various embodiments of the present disclosure, by controlling a precharge time of the bit line and the bit line bar of a memory element such as an SRAM cell by using the threshold voltage Vt of a transistor, it is possible to mitigate the stress applied to the SRAM cell and prevent distortions of the stored value of the SRAM cell.

Moreover, according to various embodiments of the present disclosure, by controlling a precharge time as described above, the memory element such as an SRAM cell may operate stably with all corners and temperatures even though a high voltage is supplied as a power supply voltage VDD to the memory element such as an SRAM cell.

Further, according to various embodiments of the present disclosure, by embodying an SRAM global counter using SRAM cells which operate stably as described above, it is possible to complete the structure of the SRAM global counter which operates stably with a high supply voltage and all corners and temperatures.

As a result, according to various embodiments of the present disclosure, since the operating margin of the SRAM global counter may be secured stably even in a high speed operation, the overall yield may be improved, and the product quality may be enhanced accordingly.

Although various embodiments have been described for illustrative purposes, it will be apparent to those skilled in the art that various changes and modifications may be made without departing from the spirit and scope of the invention as defined in the following claims.

What is claimed is:

1. A precharge circuit comprising:
a precharge time controller suitable for generating a precharge time control signal based on a detected threshold voltage of a transistor;
a precharge control signal generator suitable for generating a precharge control signal having different activation periods corresponding to a precharge time based on the precharge time control signal from the precharge time controller; and
a precharger suitable for precharging a bit line and a bit line bar based on the precharge control signal from the precharge control signal generator.

2. The precharge circuit according to claim 1, wherein the precharge time controller comprises:
a PVT sensing circuit suitable for sensing at least one of process, voltage, and temperature (PVT) conditions applied to a memory element and generating a PVT condition sensing result signal; and
a precharge time control signal generating circuit suitable for generating the precharge time control signal based on the PVT condition sensing result signal from the PVT sensing circuit.

3. The precharge circuit according to claim 2, wherein the PVT sensing circuit comprises:
a first NMOS transistor having a drain terminal to which a power supply voltage is applied, a gate terminal to which an enable signal is applied, and a source terminal which is coupled to a first node;
a first PMOS transistor having a source terminal which is coupled to the first node, and a gate terminal and a drain terminal to which a ground voltage is applied;
a second PMOS transistor having a source terminal to which the power supply voltage is applied, a gate terminal to which the ground voltage is applied and a drain terminal which is coupled to a second node;
a second NMOS transistor having a drain terminal which is coupled to the second node, a gate terminal which is coupled to the first node, and a source terminal which is coupled to a drain terminal of a third NMOS transistor; and
the third NMOS transistor having the drain terminal which is coupled to the source terminal of the second NMOS transistor, a gate terminal to which the enable signal is applied, and a source terminal to which the ground voltage is applied.

4. The precharge circuit according to claim 2, wherein the precharge time control signal generating circuit comprises:
an amplification part suitable for amplifying a PVT condition sensing result signal from the PVT sensing circuit; and
a storage part suitable for storing the PVT condition sensing result signal amplified by the amplification part.

5. The precharge circuit according to claim 4, wherein the amplification part comprises an inverter for inverting and amplifying the PVT condition sensing result signal from the PVT sensing circuit, and wherein the storage part comprises a flip-flop for storing the PVT condition sensing result signal inverted and amplified by the inverter.

6. The precharge circuit according to claim 1, wherein the precharge control signal generator generates a first precharge control signal activated during a first predetermined period in response to a first flag signal inputted from the precharge time controller, and generates a second precharge control signal activated during a second predetermined period shorter than the first predetermined period in response to a second flag signal inputted from the precharge time controller.

7. A memory device comprising:
a plurality of memory cells suitable for storing data; and
a precharge circuit suitable for precharging a selected memory cell among the plurality of memory cells with a precharge time which is varied based on a detected threshold voltage of a transistor.

8. The memory device according to claim 7, wherein the plurality of memory cells comprises a plurality of SRAM cells.

9. The memory device according to claim 7, wherein the precharge circuit comprises:
a precharge time controller suitable for generating a precharge time control signal based on the detected threshold voltage of the transistor;
a precharge control signal generator suitable for generating a precharge control signal activated during a predetermined period based on the precharge time control signal from the precharge time controller; and
a precharger suitable for precharging a bit line and a bit line bar during the predetermined period based on the precharge control signal from the precharge control signal generator.

10. The memory device according to claim 9, wherein the precharge time controller comprises:
a PVT sensing circuit suitable for sensing at least one of PVT conditions applied to the plurality of memory cells and generating a PVT condition sensing result signal; and
a precharge time control signal generating circuit suitable for generating the precharge time control signal based on the PVT condition sensing result signal from the PVT sensing circuit.

11. The memory device according to claim 10, wherein the PVT sensing circuit comprises:
a first NMOS transistor having a drain terminal to which a power supply voltage is applied, a gate terminal to which an enable signal is applied, and a source terminal which is coupled to a first node;
a first PMOS transistor having a source terminal which is coupled to the first node, and a gate terminal and a drain terminal to which a ground voltage is applied;
a second PMOS transistor having a source terminal to which the power supply voltage is applied, a gate terminal to which the ground voltage is applied and a drain terminal which is coupled to a second node;
a second NMOS transistor having a drain terminal which is coupled to the second node, a gate terminal which is coupled to the first node, and a source terminal which is coupled to a drain terminal of a third NMOS transistor; and
the third NMOS transistor having the drain terminal which is coupled to the source terminal of the second NMOS transistor, a gate terminal to which the enable signal is applied, and a source terminal to which the ground voltage is applied.

12. The memory device according to claim 10, wherein the precharge time control signal generating circuit comprises:
an amplification part suitable for amplifying the PVT condition sensing result signal from the PVT sensing circuit; and
a storage part suitable for storing the PVT condition sensing result signal amplified by the amplification part.

13. The memory device according to claim 12,
wherein the amplification part comprises an inverter for inverting and amplifying the PVT condition sensing result signal from the PVT sensing circuit, and
wherein the storage part comprises a flip-flop for storing the PVT condition sensing result signal inverted and amplified by the inverter.

14. The memory device according to claim 9, wherein the precharge control signal generator generates a first precharge control signal activated during a first predetermined in response to a first flag signal inputted from the precharge time controller, and generates a second precharge control signal activated during a second predetermined shorter than first predetermined in response to a second flag signal inputted from the precharge time controller.

15. An SRAM global counter comprising:
a counting circuit including a plurality of SRAM cells;
a precharge circuit suitable for precharging a selected SRAM cell in the counting circuit with a precharge time which is varied based on a detected threshold voltage of a transistor; and
a sense amplifier suitable for sensing the selected SRAM cell precharged by the precharge circuit.

16. The SRAM global counter according to claim 15, wherein the precharge circuit comprises:
a precharge time controller suitable for generating a precharge time control signal based on the detected threshold voltage of the transistor;
a precharge control signal generator suitable for generating a precharge control signal activated during a predetermined period based on the precharge time control signal from the precharge time controller; and
a precharger suitable for precharging a bit line and a bit line bar during the predetermined period based on the precharge control signal from the precharge control signal generator.

17. The SRAM global counter according to claim 15, wherein the precharge time controller comprises:

a PVT sensing circuit suitable for sensing at least one of PVT conditions applied to the plurality of SRAM cells and generating a PVT condition sensing result signal; and
a precharge time control signal generating circuit suitable for generating the precharge time control signal based on the PVT condition sensing result signal from the PVT sensing circuit.

18. The SRAM global counter according to claim 17, wherein the PVT sensing circuit comprises:
a first NMOS transistor having a drain terminal to which a power supply voltage is applied, a gate terminal to which an enable signal is applied, and a source terminal which is coupled to a first node;
a first PMOS transistor having a source terminal which is coupled to the first node, and a gate terminal and a drain terminal to which a ground voltage is applied;
a second PMOS transistor having a source terminal to which the power supply voltage is applied, a gate terminal to which the ground voltage is applied and a drain terminal which is coupled to a second node;
a second NMOS transistor having a drain terminal which is coupled to the second node, a gate terminal which is coupled to the first node, and a source terminal which is coupled to a drain terminal of a third NMOS transistor; and
the third NMOS transistor having the drain terminal which is coupled to the source terminal of the second NMOS transistor, a gate terminal to which the enable signal is applied, and a source terminal to which the ground voltage is applied.

19. The SRAM global counter according to claim 17, wherein the precharge time control signal generating circuit comprises:
an amplification part suitable for amplifying a PVT condition sensing result signal from the PVT sensing circuit; and
a storage part suitable for storing the PVT condition sensing result signal amplified by the amplification part.

20. The SRAM global counter according to claim 19,
wherein the amplification part comprises an inverter for inverting and amplifying the PVT condition sensing result signal from the PVT sensing circuit, and
wherein the storage part comprises a flip-flop for storing the PVT condition sensing result signal inverted and amplified by the inverter.

* * * * *